United States Patent
Polavarapu et al.

(10) Patent No.: US 6,468,860 B1
(45) Date of Patent: Oct. 22, 2002

(54) INTEGRATED CIRCUIT CAPABLE OF OPERATING AT TWO DIFFERENT POWER SUPPLY VOLTAGES

(75) Inventors: Murty S. Polavarapu, Vienna, VA (US); Jon Maimon, Manassas, VA (US)

(73) Assignee: BAE Systems Information and Electronic Systems Integration, Inc., Nashua, NH (US)

( * ) Notice: Subject to any disclaimer, the term of this patent is extended or adjusted under 35 U.S.C. 154(b) by 2 days.

(21) Appl. No.: 09/713,813

(22) Filed: Nov. 15, 2000

Related U.S. Application Data

(60) Provisional application No. 60/224,650, filed on Aug. 11, 2000.

(51) Int. Cl.$^7$ .............................................. H01L 21/336
(52) U.S. Cl. ...................... 438/257; 438/199; 438/200; 438/210; 438/216; 438/275; 257/350; 257/369
(58) Field of Search ................................ 438/199, 200, 438/210, 216, 238, 275, 257, 261; 257/392, 350, 369

(56) References Cited

U.S. PATENT DOCUMENTS

| | | | | |
|---|---|---|---|---|
| 5,432,114 A | * | 7/1995 | O ................................ | 438/217 |
| 5,953,599 A | * | 9/1999 | El-Diwany ................... | 438/199 |
| 6,071,775 A | * | 6/2000 | Choi et al. ................... | 438/257 |
| 6,297,112 B1 | * | 10/2001 | Lin et al. ..................... | 438/303 |

* cited by examiner

*Primary Examiner*—Wael Fahmy, Jr.
*Assistant Examiner*—Hsien Ming Lee
(74) *Attorney, Agent, or Firm*—Antony P. Ng.; Bracewell & Patterson, L.L.P.

(57) ABSTRACT

A method for manufacturing an integrated circuit having high voltage transistors and low voltage transistors is disclosed. First, lightly doped drains are formed in both high voltage transistors and low voltage transistors within the integrated circuit. A thin layer of silicon nitrate film is then deposited on the first and second transistors. Afterwards, a layer of silicon oxide is deposited on the silicon nitride film. After forming oxide spacers on both high voltage transistors and low voltage transistors, the oxide spacers are removed from the low voltage transistors. Finally, diffusion implants are performed on the first and second transistors. As a result, the high voltage transistors possess lightly doped drained junctions.

10 Claims, 4 Drawing Sheets

INTEGRATED CIRCUIT CAPABLE OF OPERATING AT TWO DIFFERENT POWER SUPPLY VOLTAGES

CROSS REFERENCE TO RELATED APPLICATIONS

The present application is related to a provisional application, Ser. No. 60/224,650, filed on Aug. 11, 2000, the contents of which are incorporated by reference herein.

BACKGROUND OF THE INVENTION

1. Technical Field

The present invention relates to integrated circuits in general, and in particular to integrated circuits capable of operating at two different power supply voltages. Still more particularly, the present invention relates to an integrated circuit having transistors capable of operating at a high voltage and transistors capable of operating at a low voltage.

2. Description of the Prior Art

With continuous migration of integrated circuits to smaller geometries for higher density and performance, the supply voltage for field effect transistors within an integrated circuit is also being scaled, for example, from a 5.0 V to a 3.3 V, or from a 3.3 V to 2.5 V. Because of the supply voltage transitions, it is inevitable that some components on a circuit board operate at one power supply while others operate at a different power supply. Indeed, some components may have some of their inputs/outputs operating at a first power supply voltage and other inputs/outputs operating at a second power supply voltage. Thus, it is important to be able to manufacture integrated circuits that are capable of operating at two different power supply voltages.

The current approach to manufacturing the above-mentioned integrated circuits is to use a dual gate oxide (DGO) process. However, the DGO process requires a photolithography step to be applied to a gate oxide film, and such photolithography step may cause the gate oxide film to have degraded yield or reliability. Also, the DGO process cannot overcome the problem of increased junction electric fields that is commonly associated with high voltage power supplies; thus, low-voltage devices must be designed with degraded performance in order to prevent reliability problems due to excessive electric fields on high-voltage devices. In light of the shortcomings of the DGO process, it would be desirable to provide an improved process for manufacturing integrated circuits that are capable of operating at two different power supply voltages.

SUMMARY OF THE INVENTION

In accordance with a preferred embodiment of the present invention, an integrated circuit includes high voltage transistors and low voltage transistors. Lightly doped drains are formed in both high voltage transistors and low voltage transistors within the integrated circuit. A thin layer of silicon nitrate film is then deposited on the first and second transistors. Afterwards, a layer of silicon oxide is deposited on the silicon nitride film. After forming oxide spacers on both high voltage transistors and low voltage transistors, the oxide spacers are removed from the low voltage transistors. Finally, diffusion implants are performed on the first and second transistors. As a result, the high voltage transistors possess lightly doped drained junctions.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The present invention is illustrated with a complementary-metal-oxide semiconductor (CMOS) processing method, though other types of processing technology may also be applicable.

Figure 1:
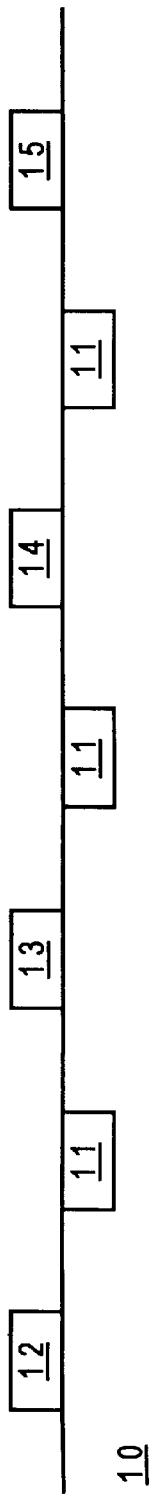
FIGS. 1–8 are cross sectional views of the steps for fabricating an integrated circuit, in accordance with a preferred embodiment of the present invention.

Referring now to the drawings and in particular to FIGS. 1–8, there are illustrated several cross sectional views of the steps for fabricating an integrated circuit, in accordance with a preferred embodiment of the present invention. The process begins with a silicon wafer (or silicon on insulator wafer) with shallow trench isolation and twin wells for CMOS devices. Threshold adjustment implants are performed and then a gate dielectric is formed. A polysilicon gate is deposited and patterned to form gates. As shown in FIG. 1, a silicon substrate 10 includes several shallow trench isolations 11 to separate polysilicon gates 12–15. In this embodiment, polysilicon gate 12 will eventually become a low voltage N-channel transistor, polysilicon gate 13 will eventually become a high voltage N-channel transistor, polysilicon gate 14 will eventually become a high voltage P-channel transistor, and polysilicon gate 15 will eventually become a low voltage P-channel transistor, as will be described herein below. In this example, low voltage is 3.3 V and high voltage is 5.0 V. Polysilicon gates 12–15 is preferably 200–300 nm high and 130–700 nm long. While gates typically have widths much greater than their lengths, FIG. 1 shows a cross sectional view along the length of gates 12–15.

Figure 2:
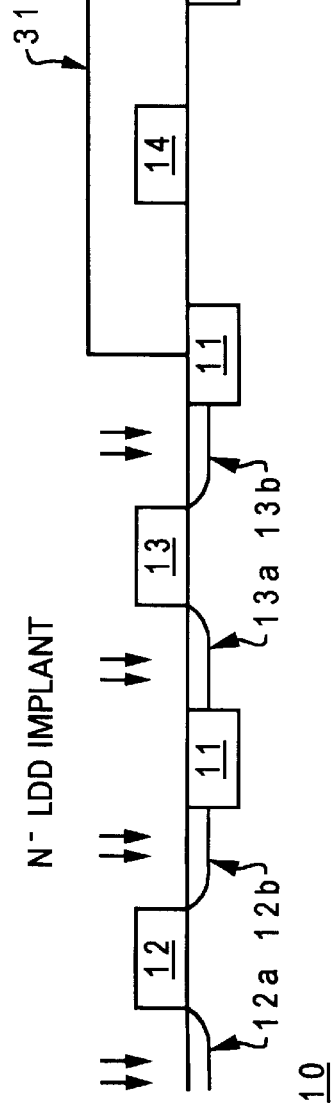
Figure 3:
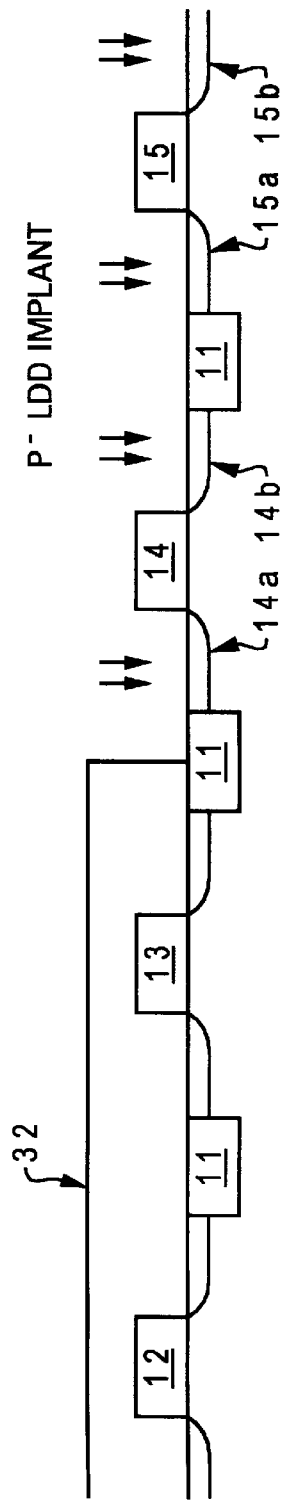

Next, lightly doped drain (LDD) implants are performed to form diffusion areas. As shown in FIG. 2, N-type LDD dopants are introduced to form source 12a and drain 12b for the 3.3 V N-channel transistor, and to form source 13a and drain 13b for the 5.0 V N-channel transistor, while polysilicon gates 14–15 are covered by a photoresist mask 31. The dose for the N-type LDD ion implant is approximately $5E^{13}$–$5E^{14}$ ions/cm$^2$. Similarly, as shown in FIG. 3, P-type LLD dopants are introduced to form source 14a and drain 14b for the 5.0 V P-channel transistor, and to form source 15a and drain 15b for the 3.3 V P-channel transistor, while polysilicon gates 12–13 are covered by a photoresist mask 32. The dose for the P-type LDD ion implant is approximately $5E^{12}$–$5E^{13}$ ions/cm$^2$. Optionally, the low voltage devices may be masked to not receive the LDD implants.

Figure 4:
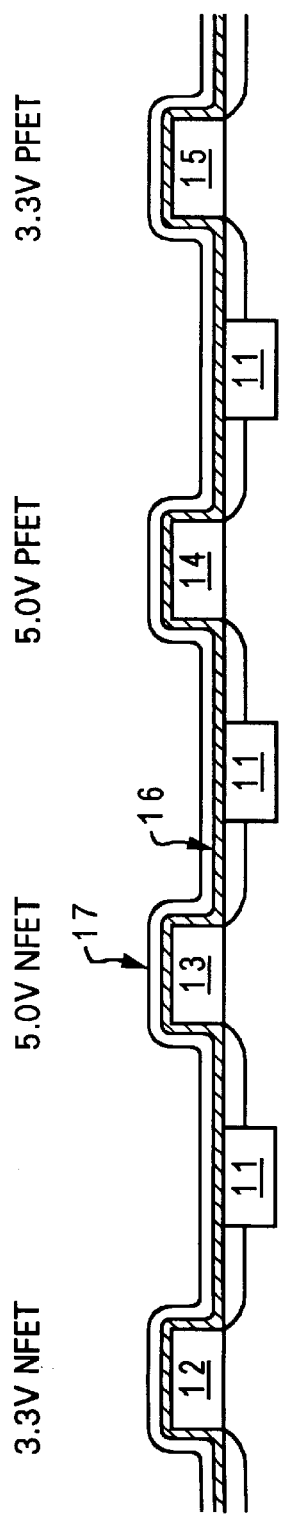

A thin silicon nitride layer 16 is subsequently formed over polysilicon gates 12–15 and diffusion areas 12a–15a and 12b–15b. Then, a layer of silicon oxide 17 is deposited over silicon nitride layer 16, as depicted in FIG. 4.

Figure 5:
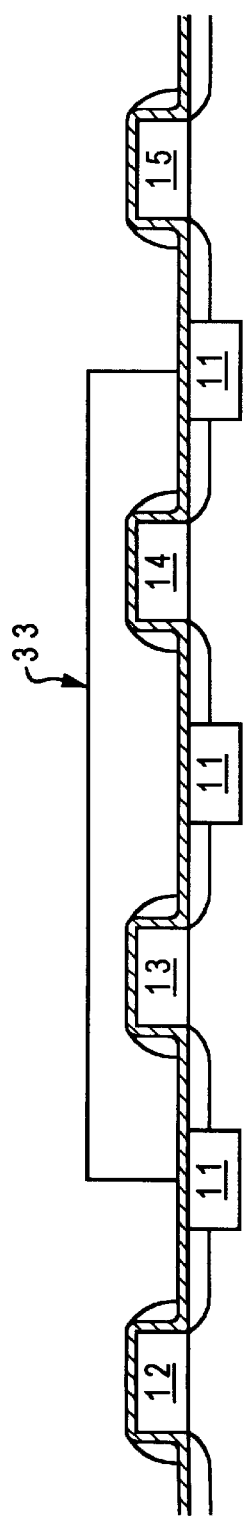

Next, sidewall dielectric (or spacers) are formed on gates 12–15 by anisotropic etching of silicon oxide layer 17. The anisotropic etching is preferably performed by a reactive ion etching (RIE) process. Subsequently, the sidewall dielectric on gates 12 and 15 are removed by a hydrochloric fluoric (HF) dip, while the sidewall dielectric on gate 13 (i.e., the 5.0 V N-channel transistor) and while the sidewall dielectric on gate 14 (i.e., the 5.0 V P-channel transistor) are covered by a photoresist mask 33, as illustrated in FIG. 5. Photoresist mask 33 is then removed afterwards.

At this point of the process, the high voltage (5.0 V) transistors have a sidewall dielectric that will be used to offset the high dose diffusion implants from the gate edge, resulting in a reduced junction electric field for the high voltage transistors. The low voltage (3.3 V) transistors have no such offset. Depending on the design of the low voltage transistors, it may be desirable for the low voltage transistors to have a non-zero offset that is smaller than the offset of the high voltage transistors. In this case, the width of the sidewall dielectric formed by etching of oxide layer 17 should be the difference between the width of the sidewall dielectric desired on the high voltage transistors and that desired on the low voltage transistors. Another oxide layer should then be deposited and etched to form a sidewall dielectric of the thickness desired for the low voltage transistors (the high voltage transistors will have a sidewall dielectric whose thickness is the sum of the two separate sidewall dielectrics).

Figure 6:
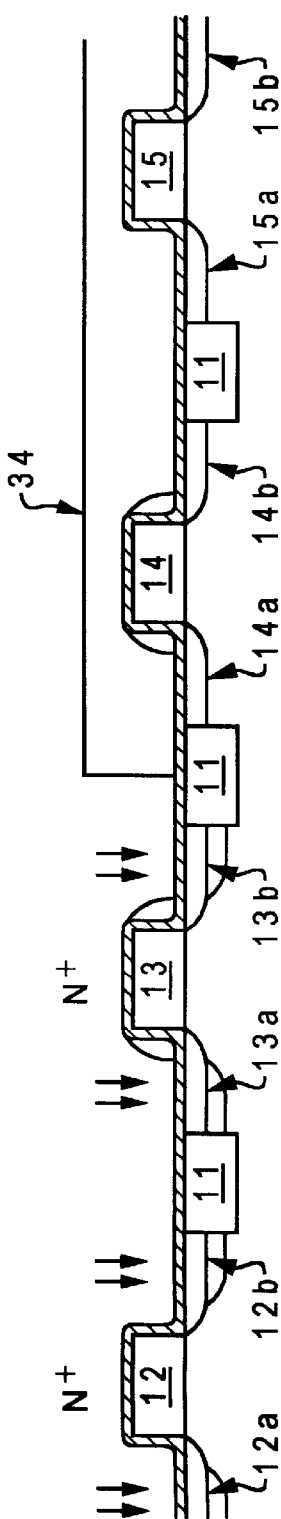

Next, $N^+$ dopants are introduced to diffusion areas 12a, 12b, 13a, and 13b, while diffusion areas 14a, 14b, 15a, and 15b are covered by a photoresist mask 34, as shown in FIG. 6. The dose for the $N^+$ ion implant is approximately $2E^{15}$ ions/cm$^2$.

Figure 7:
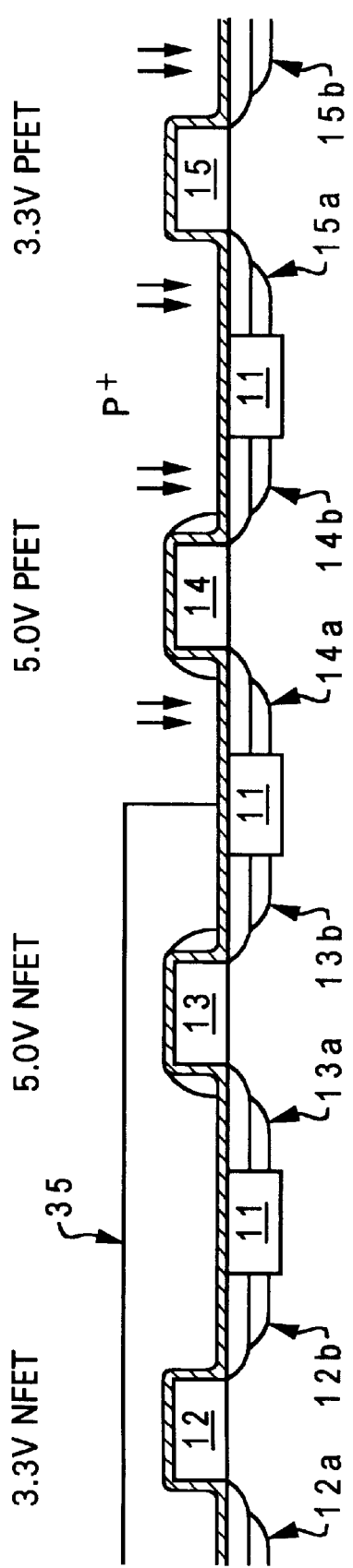

After an optional annealing process, $P^+$ dopants are introduced to diffusion areas 14a, 14b, 15a, and 15b, while diffusion areas 12a, 12b, 13a, and 13b are covered by a photoresist mask 35, as depicted in FIG. 7. The dose for the $P^+$ ion dopant is approximately $2E^{15}$ ions/cm$^2$.

Figure 8:
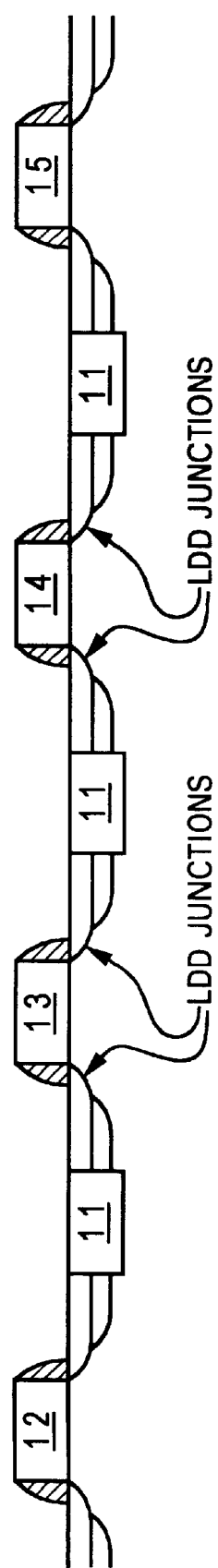

Next, an annealing process is then used to activated the implants. If a sidewall dielectric is needed for a subsequent salicide process, then an HF dip can be performed to remove the sidewall dielectric from gates 13–14, and a new set of sidewall dielectric can be formed on gates 12–15. The new set of sidewall dielectric are formed on gates 12–15 by silicon nitride deposition plus anisotropic etching of the silicon nitride layer similar to the process mentioned previously. The result is a structure having a 3.3 V N-channel transistor, a 5.0 V N-channel transistor, a 5.0 V P-channel transistor, and a 3.3 V P-channel. transistor, as shown in FIG. 8. As shown, both the 3.3 V N-channel transistor and the 3.3 V P-channel transistor have simple junctions, while both the 5.0 V N-channel transistor and the 5.0 V P-channel transistor have LDD junctions.

Figure 9:
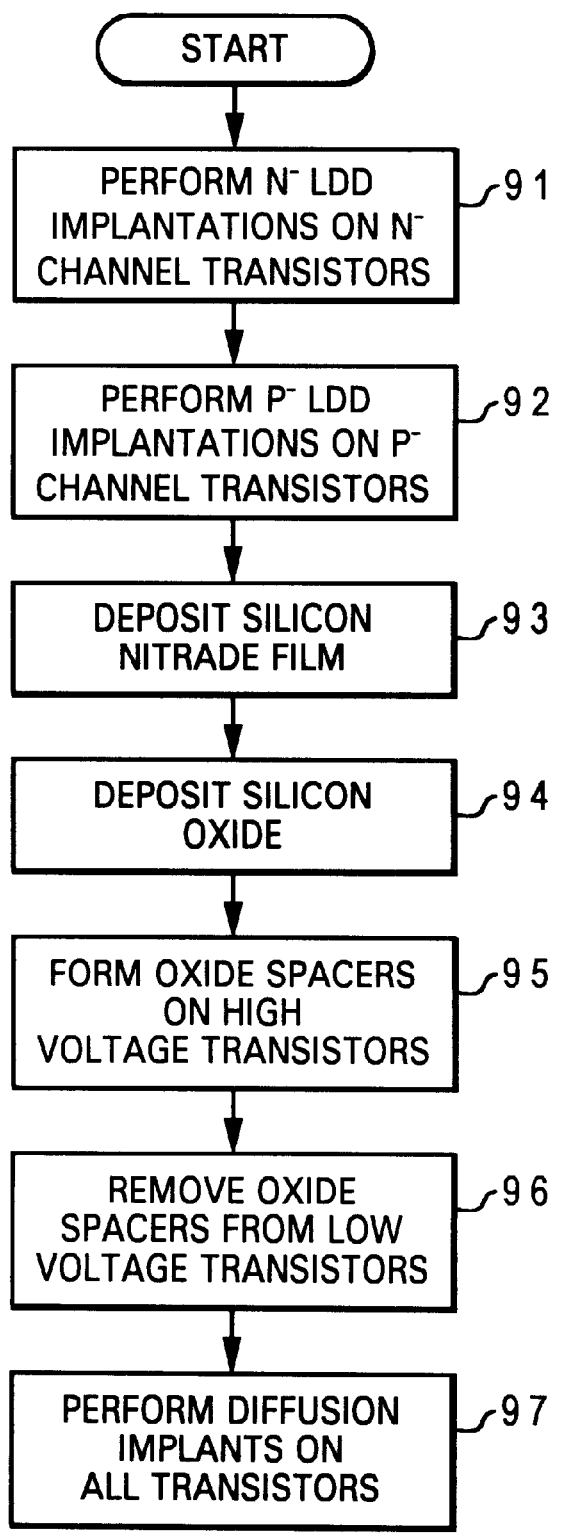
FIG. 9 is a high-level process flow diagram of a method for manufacturing an integrated circuit that is capable of operating at two different power supply voltages, in accordance with a preferred embodiment of the present invention.

Referring now to FIG. 9, there is illustrated a high-level process flow diagram of a method for manufacturing an integrated circuit that is capable of operating at two different power supply voltages, in accordance with a preferred embodiment of the present invention. After polysilicon gate electrode stack patterning has been completed, as performed in a typical CMOS process flow, the following steps are performed in sequence. First, an N-LDD implantation is performed on high voltage N-channel transistors and low voltage N-channel transistors, as shown in block 91 (see FIG. 2). Then, a P-LDD implantation is performed on high voltage P-channel transistors and low voltage P-channel transistors, as depicted in block 92 (see FIG. 3). Subsequently, a low-pressure chemical vapor deposition (LPCVD) is used to deposit a thin layer (approximately 50 Å) of silicon nitride over all the transistors, as shown in block 93 (see FIG. 4). Afterwards, a layer (approximately 1000 Å) of silicon oxide is deposited over the silicon nitride layer, as depicted in block 94 (see FIG. 4). Oxide spacers are then formed on the gate of all the transistors by performing an anisotropic oxide etch using $CO/C_4F_8$, as shown in block 95. An HF dip is then used to remove oxide spacers in the low voltage transistors, as shown in block 96 (see FIG. 5). Finally, diffusion implants are performed on the high voltage and low voltage transistors, as depicted in block 97 (see FIGS. 6, 7). As a result, the high voltage transistors possess LDD junctions.

As has been described, the present invention provides an integrated circuit having a first set of transistors capable of operating at a high voltage, and a second set of transistors capable of operating at a low voltage. The above-mentioned process flow does not explicitly call for sidewall oxide growth (or deposition) following polysilicon gate electrode patterning.

While the invention has been particularly shown and described with reference to a preferred embodiment, it will be understood by those skilled in the art that various changes in form and detail may be made therein without departing from the spirit and scope of the invention.

What is claimed is:

1. A method for manufacturing an integrated circuit having a plurality of first transistors capable of operating at a high voltage, and a plurality of second transistors capable of operating at a low voltage, said method comprising the steps of:

forming lightly doped drains in said first and second transistors within said integrated circuit;

forming oxide spacers on said first and second transistors;

removing oxide spacers from said second transistors while retaining oxide spacers on said first transistors; and performing diffusion implants on said first and second transistors.

2. The method of claim 1, wherein said method further includes a step of depositing a layer of silicon nitride film on said first and second transistors.

3. The method of claim 2, wherein said layer of silicon nitride file is approximately 50 Å.

4. The method of claim 2, wherein said method further includes a step of depositing a layer of silicon oxide on said silicon nitride film.

5. The method of claim 4, wherein said layer of silicon oxide is approximately 1000 Å.

6. The method of claim 1, wherein said step of forming lightly doped drains further includes an N-type ion implant with a dose of approximately $5E^{13}$–$5E^{14}$ ions/cm$^2$ and a P-type ion implant with a dose of approximately $5E^{12}$–$5E^{13}$ ions/cm$^2$.

7. The method of claim 1, wherein said step of diffusion implants includes an N-type ion implant with a dose of approximately $2E^{15}$ ions/cm$^2$ and a P-type ion implant with a dose of approximately $2E^{15}$ ions/cm$^2$.

8. The method of claim 1, wherein said method further includes a step of forming a thin layer of oxide spacers after said removing step.

9. The method of claim 1, wherein said high voltage is approximately 5.0 V.

10. The method of claim 1, wherein said low voltage is approximately 3.3 V.

* * * * *